United States Patent
Williams

[11] Patent Number: 5,938,853
[45] Date of Patent: Aug. 17, 1999

[54] VERTICAL VAPORIZER FOR HALIDE-FREE, SILCON-CONTAINING COMPOUNDS

[75] Inventor: Richard R. Williams, Wilmington, N.C.

[73] Assignee: Corning Incorporated, Corning, N.Y.

[21] Appl. No.: 08/780,770

[22] Filed: Jan. 8, 1997

Related U.S. Application Data

[62] Division of application No. 08/368,318, Dec. 30, 1994, Pat. No. 5,632,797.

[51] Int. Cl.$^6$ .............................. C23C 16/44; B01D 1/22
[52] U.S. Cl. ............................................ 118/726
[58] Field of Search ................................... 118/726

[56] References Cited

U.S. PATENT DOCUMENTS

| | | | |
|---|---|---|---|
| 3,438,803 | 4/1969 | Dubble et al. | 117/106 |
| 4,158,092 | 6/1979 | Botsch et al. | 528/500 |
| 5,204,314 | 4/1993 | Kirlin | 427/255.2 |

FOREIGN PATENT DOCUMENTS

| | | |
|---|---|---|
| 729 439 | 7/1932 | France . |
| WO 93/24198 | 12/1993 | WIPO . |

*Primary Examiner*—Richards Bueker
*Attorney, Agent, or Firm*—Edward F. Murphy

[57] ABSTRACT

A vaporizer for halide-free, silicon-containing liquid reactants used in producing preforms is provided. The vaporizer includes a heated, vertically-oriented expansion chamber (20) and a vertical hollow shaft (42) which extends into the chamber and has a plurality of orifices (45) at its upper end (44). Preheated reactant is supplied to the vertical shaft (42) at an elevated pressure and is sprayed onto the chamber's heated wall (22) by the orifices (45). A portion of the liquid reactant vaporizes upon entering the internal volume (24) of the chamber (20) due to the pressure drop between the inside of the shaft and the inside of the chamber. The remainder of the liquid reactant vaporizes by being heated through contact with the chamber's wall (22). Higher molecular weight species present in the raw material or generated by the vaporization process are collected in the bottom portion of the chamber where they can be periodically removed.

20 Claims, 3 Drawing Sheets

VERTICAL VAPORIZER FOR HALIDE-FREE, SILCON-CONTAINING COMPOUNDS

This is a division of application Ser. No. 08/368,318 filed Dec. 30, 1994 now U.S. Pat. No. 5,632,797.

FIELD OF THE INVENTION

This invention relates to vaporizers for use in producing preforms which can be used to produce optical or acoustic waveguide fibers either directly or through intermediate production of core cane.

BACKGROUND OF THE INVENTION

Historically, halide-containing raw materials, such as, $SiCl_4$ or mixtures of $SiCl_4$ with various dopants, have been used in the manufacture of preforms by vapor phase deposition techniques, such as, the MCVD (modified chemical vapor deposition), VAD (vapor axial deposition), and OVD (outside vapor deposition) techniques.

In the MCVD technique, the halide-containing raw materials are vaporized and reacted with oxygen to form oxide particles which are deposited on the inside of a fused-silica tube. In the VAD and OVD procedures, vaporized, halide-containing raw materials are hydrolyzed in a burner to produce soot particles which are collected on a rotating starting rod (bait tube) in the case of VAD or a rotating mandrel in the case of OVD. In some OVD systems, the cladding portion of the preform is deposited on a previously-formed core preform, rather than on a mandrel.

Various vaporizers have been developed which can be used in such processes, examples of which can be found in Aslami, U.S. Pat. No. 4,212,663, Blankenship, U.S. Pat. No. 4,314,837, Tsuchiya et al., U.S. Pat. No. 4,938,789, and U.K. Patent Publication No. 1,559,978 (hot oil heating).

In particular, French, U.S. Pat. No. 4,529,427, discloses a vaporization system in which oxygen and at least one liquid reactant, e.g., $SiCl_4$, are introduced into a heated chamber where the liquid reactant is flash vaporized. The resulting oxygen/reactant gas mixture is then used to produce the desired preform. Other flash vaporizers are disclosed in Japanese Patent Publication No. 58-125633 (see, in particular, FIG. 4) and in Antos et al., U.S. Pat. No. 5,078,092, where the material to be vaporized can be halide-free. Soubeyrand et al., U.S. Pat. No. 5,090,985, discloses the use of a horizontal thin film evaporator for vaporizing various raw materials employed in the preparation of coated glass articles.

The use of halide-containing raw materials generates substantial quantities of halide-containing by-products, e.g., hydrochloric acid. To avoid environmental pollution, these by-products must be collected, which increases the overall cost of the preform production process. Accordingly, halide-free materials and, in particular, halide-free, silicon-containing materials are desirable starting materials for the production of preforms. See Dobbins et al., U.S. Pat. No. 5,043,002.

As explained in the Dobbins et al. patent, the relevant portions of which are incorporated herein by reference, particularly preferred halide-free, silicon-containing materials for use in producing preforms are polymethylsiloxanes, with the polymethylcyclosiloxanes being particularly preferred, and with octamethylcyclotetrasiloxane (OMCTS) being especially preferred. These same halide-free, silicon-containing raw materials are preferred for use with the present invention.

Cain et al., U.S. Pat. No. 5,356,451, discloses a vaporizer specifically developed for use with halide-free, silicon-containing raw materials, such as OMCTS. In accordance with this technology, a preheater in series with a flat plate vaporizer is used to change the state of the raw material from a liquid to a vapor. Both the preheater and the flat plate vaporizer use electrical resistance wires as their source of heat. In the preheater, the liquid is heated to below its boiling point. In the flat plate vaporizer, additional heat is added to (1) bring the fluid to its boiling temperature and (2) provide the necessary energy to overcome the material's latent heat of vaporization, whereupon the fluid becomes a vapor.

Halide-free, silicon-containing materials are difficult to vaporize due to their sensitivity to cracking and polymerization when subjected to excessive temperatures. Polymerization results in the production of higher molecular weight species which form gums and gels. Additionally, higher molecular weight species may exist in the raw materials as originally manufactured. Such species do not easily vaporize and over time the polymerized materials tend to foul heat transfer surfaces and plug piping systems. Current data suggest that it may not be possible to produce vapor from materials such as OMCTS without incurring some polymerization.

SUMMARY OF THE INVENTION

In view of the foregoing considerations, it is an object of the invention to provide a vaporizer for halide-free, silicon-containing materials which (1) minimizes exposure of the material to high temperatures and (2) collects the gums and gels associated with such a material in a location where they will not foul heat transfer surfaces or plug delivery piping.

To achieve these and other objects, the invention provides a method and apparatus for vaporizing a liquid reactant, such as OMCTS, employing:

(1) a vertically-oriented expansion chamber (20) comprising a wall (22) surrounding an internal volume (24), said volume comprising a first gel collecting zone (26) located at the bottom of the chamber for collecting higher molecular weight species of the reactant and a second vaporization zone (28) said second zone located above the first zone;

(2) removing means (80) for removing higher molecular weight species of the reactant from the first gel collecting zone (26);

(3) heating means (32, 34, 36, 38, 40) for heating the chamber's wall (22) to a temperature above the boiling point of the liquid reactant at the chamber's operating pressure;

(4) introducing means (42, 44, 45) for introducing the liquid reactant into the second zone (28) and for projecting the reactant toward the chamber's wall (22);

(5) removing means (50) for removing vaporized reactant from the chamber's internal volume (24); and (6) providing means (11, 12, 13, 14, 52) for providing liquid reactant to the introducing means at a pressure above the chamber's operating pressure.

In certain preferred embodiments of the invention, the liquid reactant is heated to a sufficiently high temperature by the providing means, i.e., to a temperature above the boiling point of the liquid reactant at the expansion chamber's operating pressure, such that a portion of the liquid reactant immediately vaporizes upon entering the chamber's internal volume (24) due to a drop in pressure between the introducing means and the internal volume, said expansion chamber having a predetermined minimum pressure. The remainder of the liquid reactant is then vaporized by being heated by the chamber's heated wall (22).

In other preferred embodiments, the chamber's internal volume (24) includes a third superheating zone (30) said third zone, above the second zone (28), in which vaporized reactant is heated to a temperature above its boiling point at the chamber's operating pressure. In further preferred embodiments, the introducing means is composed of a vertical hollow shaft (42) which has an upper end (44) which is (i) located in the second zone (28) and (ii) includes a series of spray orifices (45) which are directed towards the chamber's wall (22). In some embodiments, the expansion chamber (20) includes a port for introducing a diluent gas, such as, oxygen.

The vaporizer of the invention has the following advantages over prior vaporizers: (1) the reduction of hot spots via the elimination of resistance heaters from the vaporization process; (2) the reduction in heat transfer surface fouling and delivery piping plugging via the addition of a collection sump in the vaporizer; and (3) the capability to greatly reduce the vaporization temperature by the addition of a diluent gas during the vaporization process.

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention. The drawings are not intended to indicate scale or relative proportions of the elements shown therein.

DESCRIPTION OF THE PREFERRED EMBODIMENTS

Figure 1:
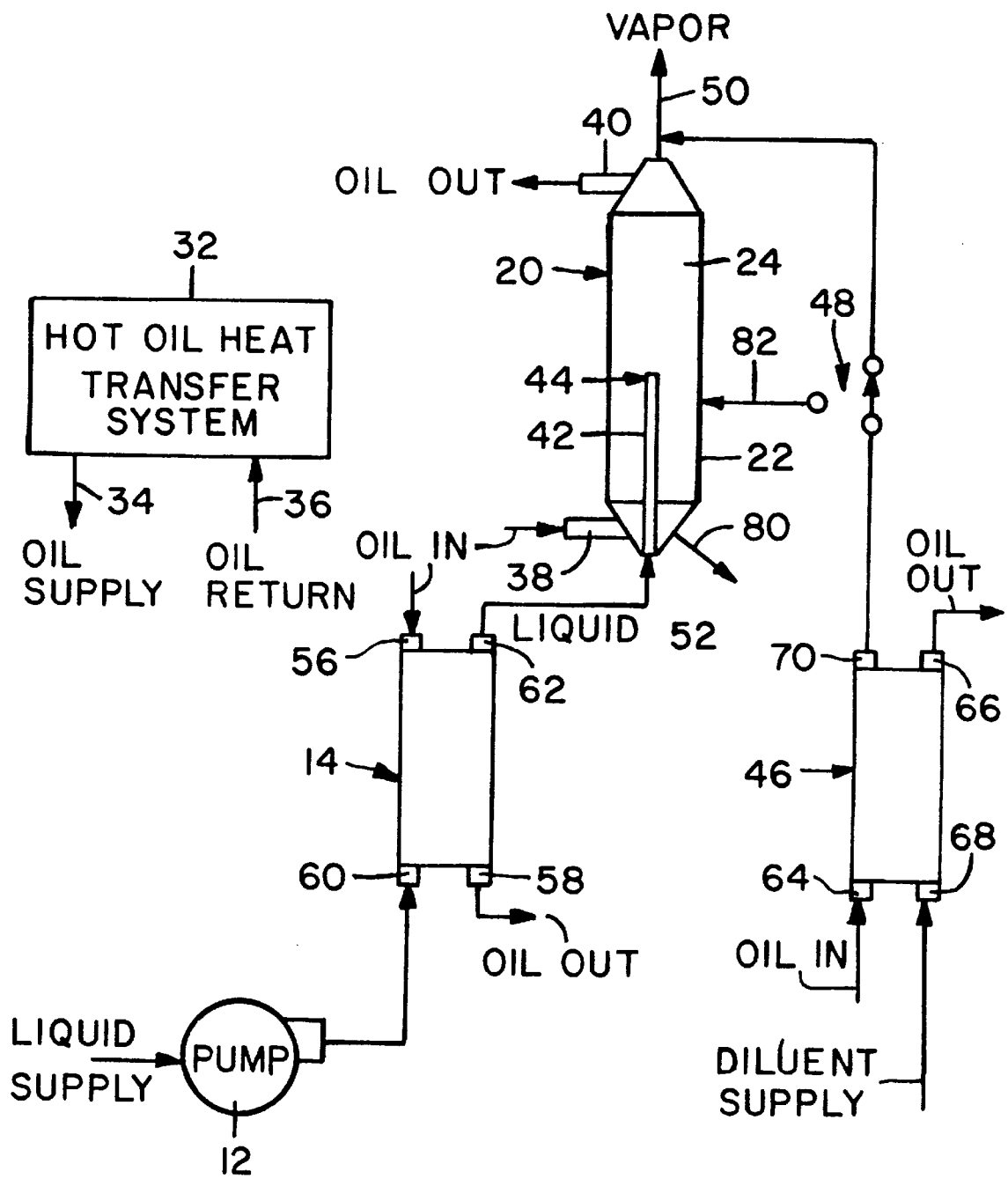
FIG. 1 is a block diagram of a vapor delivery system constructed in accordance with the present invention.

FIG. 1 illustrates an overall system for producing preforms in which the vaporizer of the present invention can be used. As shown therein, a reactant liquid, such as OMCTS, is stored in liquid feed tank 11. A metering pump 12 transfers the reactant liquid from tank 11 to preheater 14. Liquid flow meter 13 monitors the bulk liquid flow rate and sends a signal to the system's controller (not shown) which increases or decreases the rotation rate of the metering pump. As discussed in more detail below, the liquid delivered by pump 12 through liquid mass flow meter 13 is under sufficient pressure to prevent volatilization of the liquid in the preheater.

Vaporizer 15 changes the liquid reactant to a vapor. Oxygen can be added to the vaporized reactant in the vaporizer or separately in mixer 16. When added in the vaporizer, the oxygen functions as a diluent and thus allows the vaporizer to operate at a lower temperature. Other diluents, such as an inert gas, can be used, if desired.

The final step in the process is the delivery of the reactant/oxygen mixture to burners 10 which oxidize the reactant to form glass soot particles. In addition to the reactant/oxygen mixture, burners 10 are also supplied with an innershield gas, e.g., $N_2$, an outershield gas, e.g., $O_2$, and a mixture of $CH_4$ and oxygen to form a pilot flame. A burner construction for use with OMCTS and similar materials is disclosed in copending, commonly assigned, U.S. patent application Ser. No. 08/367,047, entitled "Precision Burners for Oxidizing Halide-free, Silicon-containing Compounds", which is being filed concurrently herewith in the names of Michael B. Cain, Robert B. Desorcie, William J. Kiefer, and Dale R. Powers.

Figure 2:
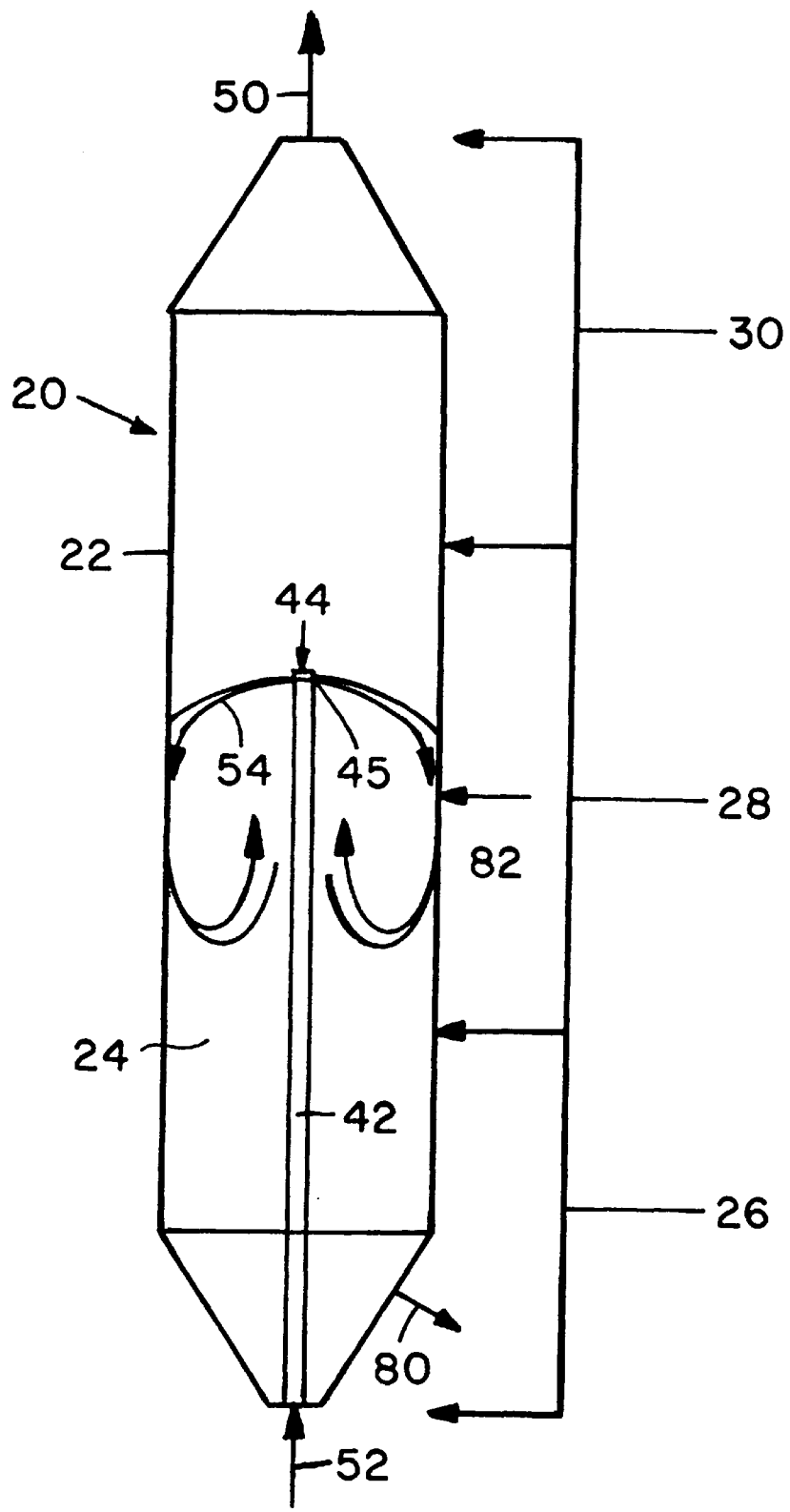
FIG. 2 is a schematic diagram of the pump, reactant preheater, diluent preheater, and expansion chamber components of the vapor delivery system of FIG. 1.
Figure 3:
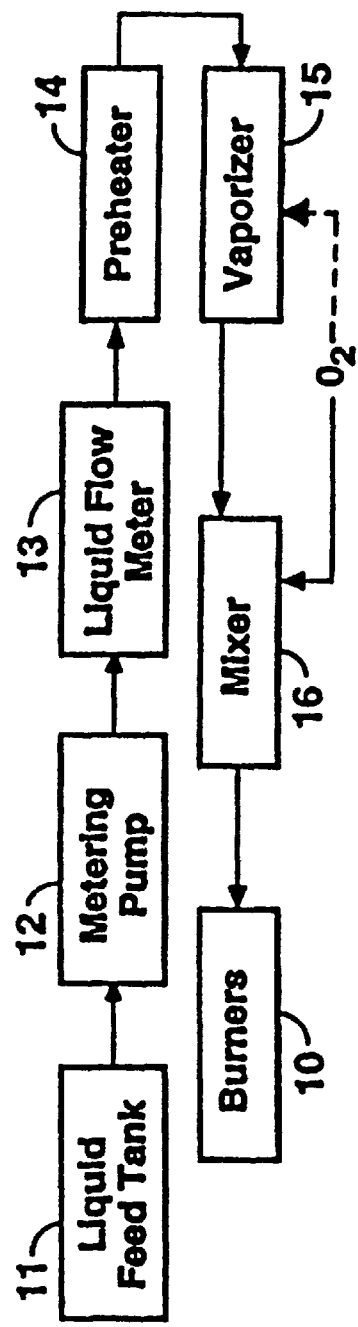
FIG. 3 is a schematic diagram of the expansion chamber component of the vapor delivery system of FIG. 1.

FIGS. 2 and 3 illustrate various components of the invention in more detail. In particular, these figures show pump 12, hot oil heat transfer system 32, reactant preheater 14, diluent preheater 46, vertical expansion chamber 20, and vertical hollow shaft 42 having spray orifices 45 at its upper end 44.

Spray orifices 45 are sized to provide sufficient back pressure in preheater 14 so that the reactant does not vaporize (boil) therein. Such boiling results in flow oscillations in the system, which, in turn, can result in variations in the operation of burners 10 and thus in the optical fiber preform.

The amount of back pressure needed depends upon the temperature to which the reactant is to be heated in preheater 14 and the vapor pressure of the reactant at that temperature. The size(s) of the orifice(s) needed to produce the desired back pressure depends upon the reactant flow rates which the system is to provide and, in particular, the lowest desired flow rate through the system since the back pressure produced by an orifice decreases as the flow rate decreases.

In practice, preferred reactant flow rates for producing preforms using OMCTS as the halide-free, silicon-containing raw material can be in the range of from about 80 grams/minute to about 200 grams/minute or higher. A preferred operating temperature for preheater 14 is about 190° C. for a system in which oxygen is added in mixer 16, rather than to vaporizer 15 (FIG. 1). The boiling point of OMCTS at atmospheric pressure is about 175.5° C. To prevent OMCTS from boiling at 190° C. requires a back pressure in preheater 14 of at least about 10 psig. Preferably, a somewhat higher minimum back pressure, e.g., a back pressure of about 15 psig, is used. In this way, the liquid reactant is maintained as a subcooled (compressed) liquid in preheater 14, as is desired.

Orifices having a diameter of about 0.25 mm, e.g., six orifices distributed around the circumference of vertical shaft 42, have been found to produce the desired 15 psig back pressure for reactant flow rates as low as 80 grams/minute. Appropriate orifice sizes for other flow rates and back pressures can be readily determined by persons skilled in the art based on the disclosure herein.

As shown in FIG. 2, the basic process begins with the pumping of liquid reactant through preheater 14. Pump 12 delivers the liquid reactant at the desired flow rate called for by the system's controller. This pump, which can, for example, be a gear pump, must be sized to deliver the required head (pressure) at the desired flow rate.

Preheater 14 is preferably configured to add sufficient heat to the liquid reactant so that it will at least partially vaporize as its pressure drops across orifices 45 upon entering the internal volume 24 of expansion chamber 20. Preheater 14 is preferably a plate type heat exchanger sized to add all the heat required to bring the liquid reactant from room temperature to just below its boiling point at the back pressure established by orifices 45 at the system's minimum reactant flow rate. In particular, preheater 14 preferably heats the liquid reactant to a temperature in a range whose upper end is the temperature at which the reactant is a saturated liquid at the minimum back pressure established by orifices 45 (the saturation temperature) and whose lower end is the saturation temperature minus 50° C. The overriding consideration, however, is minimizing polymerization of the reactant and thus preheater 14 is preferably run at as low a temperature as possible. In particular, preheater 14 is preferably run at the minimum temperature for which the reactant will at least partially vaporize upon entering chamber 20, e.g., at a temperature about 10° C. higher than the boiling point of the reactant at the chamber's operating pressure. For OMCTS as the reactant and for an operating pressure in chamber 20 of about 1 psig, 190° C. is such a minimum temperature for preheater 14.

The system can also be operated with preheater 14 configured so that the temperature of the liquid reactant leaving the preheater is below the boiling point of the reactant at the expansion chamber's operating pressure. In such a case, vaporization will not occur as a result of the pressure drop across orifices 45 since at steady state, the reactant vapor is substantially at saturation in vaporization zone 28. For this configuration, all of the vaporization results from heating of the liquid reactant by the chamber's heated wall 22. Along these same lines, preheater 14 can be eliminated and the expansion chamber sized, e.g., made longer, so that all heating of the reactant takes place in the expansion chamber. Such an approach, however, is not preferred since it tends to make the system susceptible to flow oscillations at high flow rates.

The heat is preferably added to the liquid reactant by means of hot oil heat transfer system 32, which has an oil supply 34 and an oil return 36 which are connected to oil inlet port 56 and oil outlet port 58 of preheater 14 by conventional supply lines and fittings (not shown).

A preferred oil for use in the hot oil heat transfer system is silicone oil, although other fluids can be used if desired. As discussed above, a preferred oil temperature is 190° C. when OMCTS is the reactant liquid. It should be noted that as shown in FIG. 2, a single hot oil heat transfer system is used for preheater 14, expansion chamber 20, and diluent preheater 46, so that all of these components operate at about the same temperature, e.g., 190° C. If desired, the components can be operated at different temperatures by using separate heating systems for each component. Use of a hot oil system is preferred for preheater 14 and expansion chamber 20. Other heating means, including electrical heating, can be used.

Liquid reactant enters preheater 14 through liquid entry port 60 and leaves the preheater through liquid exit port 62. To minimize the residence time of the liquid reactant in the preheater and thus the opportunities for polymerization, a preheater having a single, straight through, reactant flow channel, surrounded by hot oil channels, is preferred, although other constructions can be used if desired. As indicated above, a plate type preheater is preferred, and a preferred spacing between the plates is approximately 1.2 mm. The use of fluid-to-fluid heat transfer provides uniform heating and ensures the absence of hot spots which can lead to polymerization of the reactant.

The heated liquid reactant is delivered from preheater 14 to expansion chamber 20 by conduit 52. The expansion chamber includes internal volume 24 for free expansion of vapor and heated wall 22 for adding any additional heat required for complete vaporization and a slight amount of superheat. The chamber also acts as a collection area for gums and gel and provides for the addition of a diluent gas if desired.

Heating of wall 22 is preferably performed by passing a heated fluid, e.g., hot oil from hot oil heat transfer system 32, over at least a portion of the outside surface of the wall. Preferably, the entire internal surface of wall 22 is heated to the same temperature, e.g., 190° C. A heating jacket surrounding the chamber and having an inlet 38 and an outlet 40 can be used for this purpose. In FIG. 2, the inlet and outlet are connected to oil supply 34 and oil return 36 by conventional supply lines and fittings (not shown). As shown in FIGS. 2 and 3, chamber 20 has upper and lower conical portions and a cylindrical center portion. Distribution manifolds (not shown) can be used at the interfaces between the conical portions and the cylindrical portion to provide for a uniform distribution of hot oil around the circumference of wall 22.

As shown in FIG. 3, chamber 20 includes a lower gel collecting zone 26, a middle vaporization zone 28, and an upper superheating zone 30. Gel collection zone 26 includes port 80 for removing higher molecular weight species separated from the reactant vapor stream by the vertical vaporizer during, for example, periodic maintenance of the system. For OMCTS, a gel production rate of approximately 100 ppm has been observed for the vaporization process, that is, for every million grams of OMCTS vaporized by the system of FIG. 1, approximately 100 grams of gel are collected in gel collection zone 26.

The heated liquid reactant is introduced into chamber 20 by means of hollow vertical shaft 42 whose upper end constitutes an orifice head. A preferred inside diameter for shaft 42 is approximately 4 mm. The orifice head is located some distance into the expansion chamber and directs the liquid reactant against the inside surface of wall 22 in the region of vaporization zone 28. In particular, the orifice head needs to be located far enough into the chamber so that flow from the head does not pick up substantial amounts of gel from gel collection zone 26. For example, for a chamber having an overall length of about 75 cm composed of two conical portions, each 15 cm long, and a central cylindrical portion 45 cm long, an orifice location about 55 cm from the bottom of the chamber has been found to work successfully.

The orifice head may contain multiple orifices to distribute the fluid along the wall of the chamber. Alternatively, a single orifice in combination with a set of slots and/or baffles to direct the fluid against the side wall of the chamber can be used. Other designs for spraying a liquid in a pattern like that illustrated at 54 in FIG. 3 can be used if desired.

Expansion chamber 20 should have a cross sectional area which is large enough to keep the velocity of the reactant relatively low so as to allow separation of any gel and to minimize gel carry over. In practice, for the 75 cm chamber described above, an inside diameter of about 8 cm has been found to produce the desired low flow velocity within chamber 20, e.g., a flow velocity of less than about 0.5 meters/second, and preferably about 0.1 meters/second, for a reactant feed rate of about 200 grams/minute with oxygen being added in mixer 16.

In the preferred mode of operation, a portion of the heated liquid reactant immediately vaporizes upon entering vaporization zone 28 due to the drop in pressure between the inside of shaft 42 and the inside of chamber 20, e.g., the drop from 15 psig (or higher at high flow rates) inside shaft 42 to 1 psig inside chamber 20. (Note that, as discussed above, such immediate vaporization only takes place if preheater 14 has raised the temperature of the liquid reactant above the boiling point of the reactant at the expansion chamber's operating pressure.) The amount of reactant that immediately vaporizes will depend upon the amount of heating performed in preheater 14, i.e., it will depend on the temperature of the liquid reactant as it enters chamber 20 relative to the enthalpy of vaporization of the reactant.

Although the temperature of the liquid reactant could be made sufficiently high to achieve substantially full immediate vaporization, such heating would defeat the purpose of avoiding polymerization of the reactant resulting from exposure to excessively high temperatures. For example, for OMCTS, full immediate vaporization would require heating to a temperature of about 250° C., at which temperature substantial polymerization would be much more likely than at 190° C.

To avoid this problem, in accordance with the preferred embodiments of the invention, only a portion of the liquid reactant is immediately vaporized upon entry to chamber 20, e.g., about 15%, with the remainder being vaporized by being sprayed onto heated wall 22.

The portion of liquid reactant that vaporizes upon entry into chamber 20 can be increased by introducing a diluent gas into the chamber so as to reduce the partial pressure of the liquid reactant in the chamber and thus lower its dew point. Alternatively, the diluent gas can be used to lower the temperature to which the liquid reactant must be heated in preheater 14 to achieve a desired level of immediate vaporization in chamber 20. For example, by introducing oxygen into chamber 20 at a flow rate of 0.3 slpm (standard liters per minute) of $O_2$ per gram/minute of OMCTS, vaporization of OMCTS through a combination of immediate vaporization and heating by wall 22 can be achieved with the temperature of the heating oil provided by hot oil heat transfer system 32 reduced from 190° C. to about 150° C.

As shown in FIG. 2, the diluent gas is heated by preheater 46 which has a diluent entrance port 68 and a diluent exit port 70. Preheater 46 also has oil ports 64 and 66 which are connected to oil supply 34 and oil return 36 by conventional supply lines and fittings (not shown). Preheater 46 is preferably a plate type heater.

Exit port 70 is connected to two-position valve 48. For the valve position shown in FIG. 2, diluent gas is added to the flow of reactant vapor leaving chamber 20 through conduit 50, e.g., the diluent gas is added in mixer 16 of FIG. 1. In the alternate position, the diluent gas is added to chamber 20 through port 82 through wall 22. Instead of a variable two-position valve, the system can be permanently configured to either supply or not supply diluent gas to chamber 20. Also, not all of the diluent gas needs to be added to chamber 20, but some can be added downstream in mixer 16. For example, valve 48 can provide flow to both port 82 and conduit 50.

If the mole fraction of diluent gas introduced into chamber 20 is sufficiently high, a major portion of the liquid reactant can be immediately vaporized upon entry into the chamber without the need to raise the temperature of the liquid in preheater 14 to a point where polymerization becomes a serious problem. In such a case, the portion of the liquid reactant which is vaporized by being heated by the chamber's wall can be quite small. Adding diluent gas to chamber 20 can result in somewhat higher levels of carry-over of higher molecular weight species of the reactant into the vapor stream leaving chamber 20 through conduit 50. Also, the addition of oxygen as the diluent gas may lead to higher levels of production of higher molecular weight species of the reactant.

Once transformed into a vapor, the reactant leaves chamber 20 through conduit 50. In doing so, it passes through zone 30 where it is superheated to a temperature above its boiling pointed. A preferred amount of superheating in zone 30 can be on the order of about 5° C., e.g., for OMCTS and an operating pressure within chamber 20 of 1 psig, the reactant vapor can be heated to a temperature of about 185° C.

The components of the vaporizer can be made of various standard materials known to those skilled in the art. For example, the reactant contacting portions of expansion chamber 20 and vertical shaft 42 are preferably made of stainless steel. Other materials can be used if desired.

Although preferred and other embodiments of the invention have been described herein, additional embodiments may be perceived by those skilled in the art without departing from the scope of the invention as defined by the following claims.

What is claimed is:

1. An apparatus for vaporizing a reactant in liquid form into a reactant vapor, said apparatus comprising:
   (a) a wall surrounding an internal volume, said internal volume comprising a first zone, a second zone adjacent said first zone, and a third zone adjacent said second zone,
   (b) an introducing means for introducing the reactant in liquid form into the interval volume where said reactant in liquid form is vaporized into a reactant vapor;
   (c) said third zone comprising a heating means for heating said reactant vapor to a temperature above its boiling point;
   (d) a reactant vapor conduit; and
   (e) a vapor utilization site; wherein said reactant vapor conduit delivers said reactant vapor to said vapor utilization site where said reactant vapor is decomposed to form silicon dioxide containing particles.

2. The apparatus of claim 1, wherein said reactant comprises a siloxane.

3. The apparatus of claim 1, wherein said reactant comprises octamethylcyclotetrasiloxane.

4. The apparatus of claim 1, wherein said reactant comprises a polymethylcyclosiloxane.

5. An apparatus for vaporizing a reactant in liquid form into a reactant vapor used to make silicon dioxide, said apparatus comprising:
   (a) a vertically-oriented expansion chamber comprising a first zone, a second zone located above the first zone, and a third zone located above the second zone;
   (b) said second zone comprised of an introducing means for introducing the reactant in liquid form into the second zone where said reactant in liquid form is vaporized into a reactant vapor;
   (c) said third zone comprised of a heating means for heating said reactant vapor to a temperature above its boiling point.

6. The apparatus of claim 5, wherein said reactant comprises a siloxane.

7. The apparatus of claim 5, wherein said reactant comprises octamethylcyclotetrasiloxane.

8. The apparatus of claim 5, wherein said apparatus further comprises:
   (a) a reactant vapor conduit; and
   (b) a vapor utilization site; wherein said reactant vapor conduit delivers said reactant vapor to said vapor utilization site where said reactant vapor is made into silicon dioxide.

9. An apparatus for providing reactant vapors for making silicon dioxide by decomposing said reactant vapors to form particles, said apparatus comprising:

(a) a vertically-oriented expansion chamber comprising a first zone located at the bottom of the chamber and a second zone located above the first zone;

(b) said second zone comprising an introducing means for introducing a reactant in liquid form into the second zone where the reactant in liquid form is vaporized into a reactant vapor;

(c) said reactant being polymerizable to form a byproduct gel;

(d) said first zone comprising a gel collecting zone for collecting the byproduct gel.

10. The apparatus of claim 9 wherein said byproduct gel is gravitationally separated from said reactant vapor and said reactant in liquid form.

11. The apparatus of claim 9 wherein said gel collecting zone comprises a removing means for removing said byproduct gel from said gel collecting zone.

12. The apparatus of claim 9, wherein said expansion chamber further comprises a third zone above said second zone, said third zone comprising a heating means for heating said reactant vapor to a temperature above its boiling point.

13. The apparatus of claim 9, wherein said reactant comprises a siloxane.

14. The apparatus of claim 9, wherein said reactant comprises a polymethylsiloxane.

15. The apparatus of claim 9, wherein said reactant comprises a polymethylcyclosiloxane.

16. The apparatus of claim 9, wherein said reactant comprises octamethylcyclotetrasiloxane.

17. The apparatus of claim 9, wherein said silicon dioxide is formed into a preform.

18. The apparatus of claim 9, wherein said silicon dioxide if formed into an optical waveguide fiber.

19. The apparatus of claim 9, further comprising:

(a) a reactant vapor conduit, said conduit for delivery of said reactant vapor to a vapor utilization site.

20. An apparatus for providing reactant vapors which are decomposed to form silicon dioxide particles used in the formation of a preform, said apparatus comprising:

(a) a vertically-oriented expansion chamber comprising a wall surrounding an internal volume, said internal volume comprising a byproduct gel collecting zone located at the bottom of the chamber for collecting a byproduct gel, and a second zone, said second zone located above the byproduct gel collecting zone;

(b) introducing means for introducing a reactant in liquid form into said second zone, said reactant being polymerizable to form a byproduct gel;

(c) vaporizing means for vaporizing said reactant;

(d) wherein a byproduct gel formed by said reactant collects in said byproduct gel collecting zone.

* * * * *